United States Patent
Chao (10) Patent No.: US 11,637,561 B2
(45) Date of Patent: Apr. 25, 2023

(54) METHOD OF DATA CONVERSION FOR COMPUTING-IN-MEMORY

(71) Applicant: Yuan-Ju Chao, Cupertino, CA (US)

(72) Inventor: Yuan-Ju Chao, Cupertino, CA (US)

(73) Assignee: IP Great Incorporated, Grand Cayman (KY)

( * ) Notice: Subject to any disclaimer, the term of this patent is extended or adjusted under 35 U.S.C. 154(b) by 335 days.

(21) Appl. No.: 16/950,950

(22) Filed: Nov. 18, 2020

(65) Prior Publication Data

US 2022/0158651 A1    May 19, 2022

(51) Int. Cl.
| | |
|---|---|
| *H03M 1/66* | (2006.01) |
| *H03M 1/74* | (2006.01) |
| *H03M 1/38* | (2006.01) |
| *G06F 3/06* | (2006.01) |
| *G06F 7/544* | (2006.01) |
| *G11C 11/40* | (2006.01) |
| *G11C 11/408* | (2006.01) |

(52) U.S. Cl.
CPC .......... *H03M 1/742* (2013.01); *G06F 3/0604* (2013.01); *G06F 3/0659* (2013.01); *G06F 3/0679* (2013.01); *G06F 7/5443* (2013.01); *H03M 1/38* (2013.01); *G11C 11/40* (2013.01); *G11C 11/408* (2013.01)

(58) Field of Classification Search
CPC ....... H03M 1/742; H03M 1/38; G06F 3/0604; G06F 3/0659; G06F 3/0679; G06F 7/5443; G11C 11/40; G11C 11/408
See application file for complete search history.

(56) References Cited

U.S. PATENT DOCUMENTS 11,404,106 B2 *   8/2022   Papageorgiou ........ G06N 3/048

* cited by examiner

*Primary Examiner* — Joseph J Lauture
(74) *Attorney, Agent, or Firm* — Patent PC; Bao Tran (57) ABSTRACT

Computing-in-memory utilizes memory as weight for multiply-and-accumulate (MAC) operations. Input data multiplies weights to produce output data during the operation. Method of data conversion from input data, memory element to output data is described to enhance the computing efficiency.

18 Claims, 9 Drawing Sheets input data (IN)

weights (W)

output data (OUT)

$$[X_0 \; X_1 \; \ldots \; X_n] * \begin{bmatrix} A_0 & B_0 & C_0 \\ A_1 & B_1 & C_1 \\ \vdots & \vdots & \vdots \\ A_n & B_n & C_n \end{bmatrix} = \begin{bmatrix} Y_A = X_0 A_0 + X_1 A_1 + X_2 A_2 + \ldots + X_n A_n \\ Y_B = X_0 B_0 + X_1 B_1 + X_2 B_2 + \ldots + X_n B_n \\ Y_C = X_0 C_0 + X_1 C_1 + X_2 C_2 + \ldots + X_n C_n \end{bmatrix}$$

→ Implemented using memory

METHOD OF DATA CONVERSION FOR COMPUTING-IN-MEMORY

BACKGROUND

Figure 1:
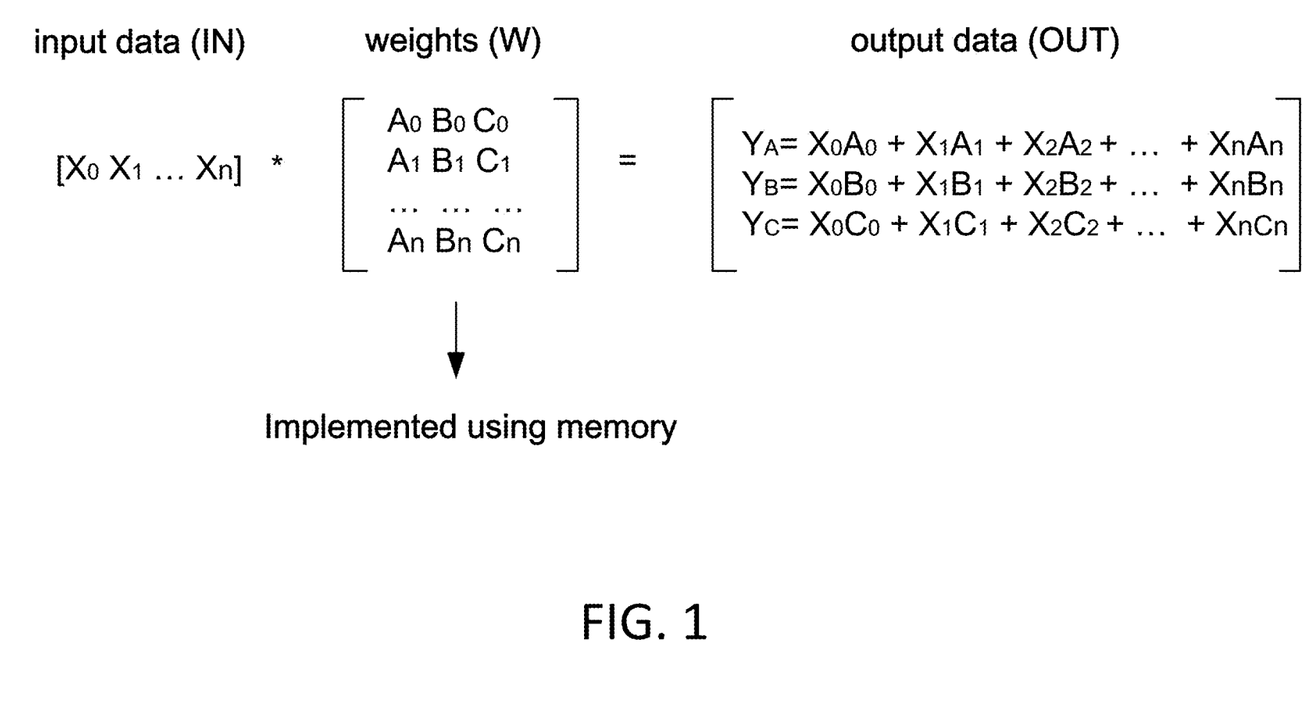
FIG. 1 illustrates the diagram of MAC operation

To achieve specified accuracy, advanced Artificial Intelligence (AI) edge chips require multi-bit input data (IN), weight (W), and output data (OUT) for multiply-and-accumulate (MAC) operations. Computing-in-memory is effective in improving the energy efficiency of multiply-and-accumulate (MAC) operations. FIG. 1 illustrates the diagram of MAC operation, wherein input data (IN) multiplies weights (W) to obtain output data (OUT). This matrix multiplication can be performed using computing-in-memory wherein the weights are implemented using memory element such as Static random-access memory (SRAM) or non-volatile Flash memory.

SUMMARY

In a first aspect, a data converter for computing-in-memory includes an N-row receive path and an M-column transmit path coupled in a mesh structure; each receive path row including one Digital-to-Analog Converter (DAC) and multiple memory elements, wherein each transmit path column consists of one Analog-to-Digital Converter (ADC) and multiple memory elements.

In a second aspect, a method of data conversion for computing-in-memory, includes forming an N-row receive path and an M-column transmit path; coupling the paths in a mesh structure; converting each receive path row with one DAC and multiple memory elements; and digitizing each transmit path column having one ADC and multiple memory elements.

In another aspect, a method of data conversion for computing-in-memory achieves high accuracy and efficiency computing. Multiple Digital-to-Analog Converter (DAC) and multiple Analog-to-Digital Converter (ADC) operate with multiple memory elements to perform the multiplication function. Input data is connected to DAC, DAC drives memory elements and ADC samples memory output to produce output data. This method results in high performance, low power consumption and low silicon area integrated Artificial Intelligence (AI) chips.

In yet another aspect, a method for computing-in-memory utilizes memory as weight for multiply-and-accumulate (MAC) operations. Input data multiplies weights to produce output data during the operation. Method of data conversion from input data, memory element to output data is described to enhance the computing efficiency. On the input part, input data is coupled to Digital-to-Analog Converter (DAC), DAC's output is coupled to a buffer. On the output part, memory element is coupled to trans-impedance amplifier (TIA), TIA's output is sampled by Successive-Approximation-Register Analog-to-Digital Converter (SARADC) to yield the final output data.

In implementations, the method employs single-end current steering Digital-to-Analog Converter (DAC) to convert digital input data to analog current. The current is converted to a voltage through DAC's loading resistor and a buffer. The voltage drives multiple memory element and produces current with respective to the voltage. The current is converted to voltage through a Trans-impedance Amplifier (TIA) or Integrator. The converted voltage is amplified by Variable Gain Amplifier (VGA) then sampled by Successive-Approximation-Register Analog-to-Digital Converter (SARADC) and converted into final digital output data.

Advantages of the described conversion include superior signal integrity, high conversion rate, high accuracy, low power consumption and small silicon area.

A more complete appreciation of the present invention and its improvements can be obtained by reference to the accompanying drawings, which are briefly summarized below, to the following detailed description of illustrative embodiments of the invention, and to the appended claims.

DETAILED DESCRIPTION

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes.

The terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Furthermore, it is to be noticed that the term "comprising", used in the claims, should not be interpreted as being restricted to the means listed thereafter; it does not exclude other elements or steps. Thus, the scope of the expression "a device comprising means A and B" should not be limited to devices consisting only of components A and B. It means that with respect to the present invention, the only relevant components of the device are A and B.

Similarly, it is to be noticed that the term "coupled" discloses both direct and indirect coupling and should not be interpreted as being restricted to direct connections only. Thus, the scope of the expression "a device A coupled to a device B" should not be limited to devices or systems wherein an output of device A is directly connected to an input of device B. It means that there exists a path between an output of A and an input of B which may be a path including other devices or means.

Figure 2:
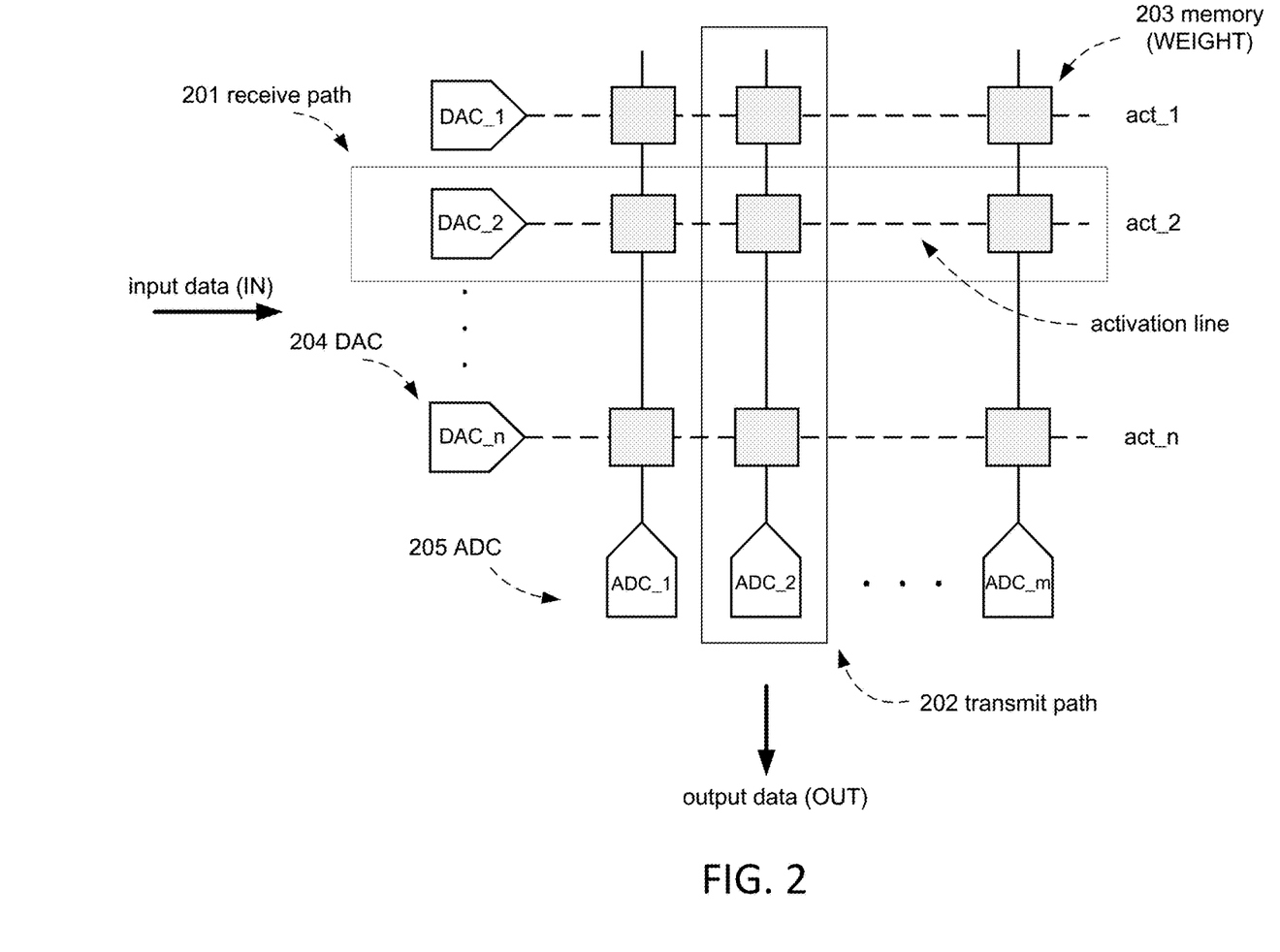
FIG. 2 shows the implementation of MAC operation using computing-in-memory

FIG. 2 illustrates the implementation of MAC operation using computing-in-memory. There are N rows of receive path 201 and M columns of transmit path 202 forming a coupled mesh structure. Each receive path 201 comprises one DAC 204 and multiple memory elements 203. Each transmit path 202 comprises one ADC 205 and multiple memory elements. Multiple memory elements are connected together by the activation lines. Input data (IN) is coupled to DAC's and output data (OUT) is coupled to ADC's. The N×M memory matrix represents weights for multiply-and-accumulate (MAC) operations.

Figure 3:
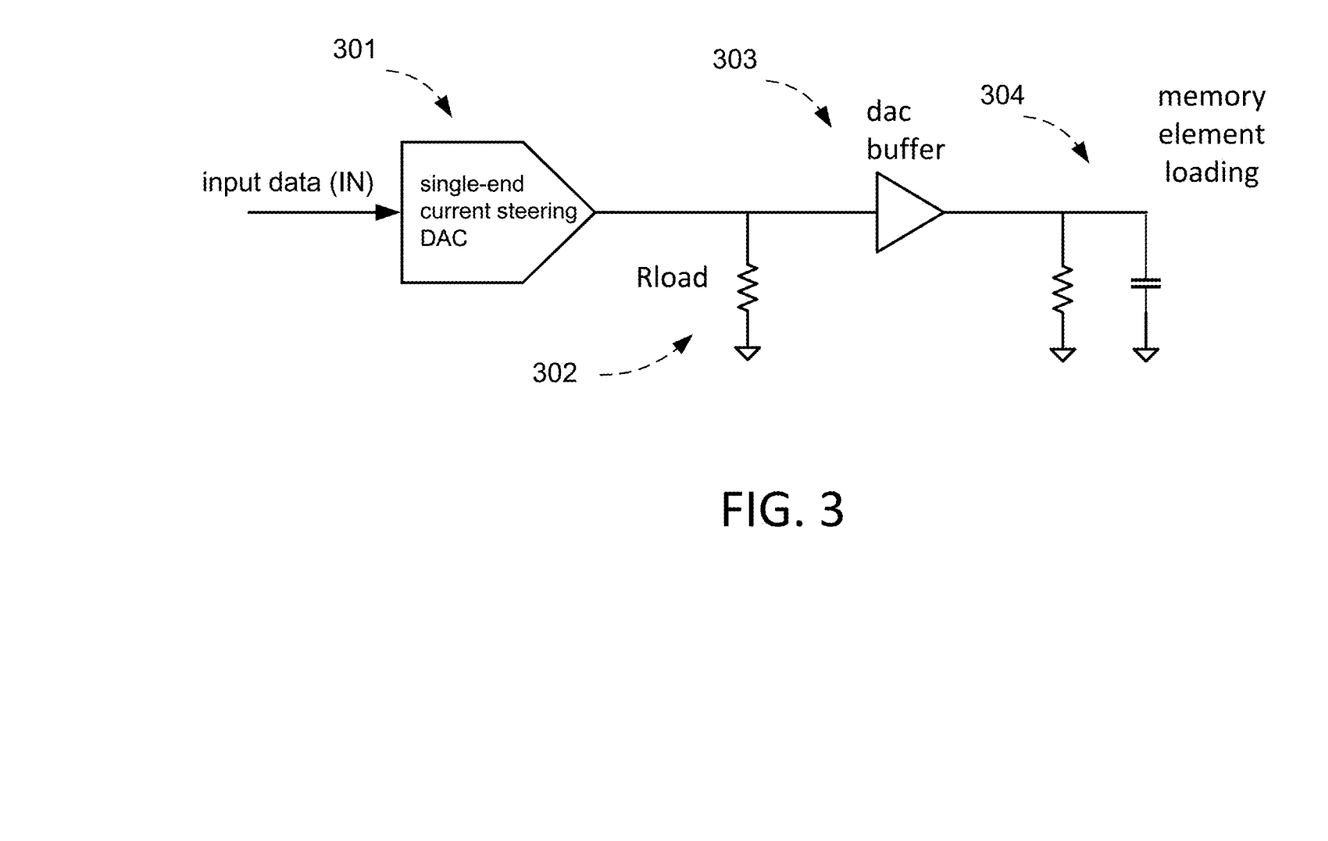
FIG. 3 shows the exemplary implementation of the receive path

FIG. 3 shows the exemplary implementation of the receive path 201. It comprises a single-end current steering DAC 301, resistive loading 302, dac buffer 303 and memory element loading 304. Input data couples to DAC 301 and convert input data to analog current. This current flows into Rload 302 and produces corresponding voltage. The generated voltage couples to dac buffer and drive multiple memory elements in the receive path.

Figure 4:
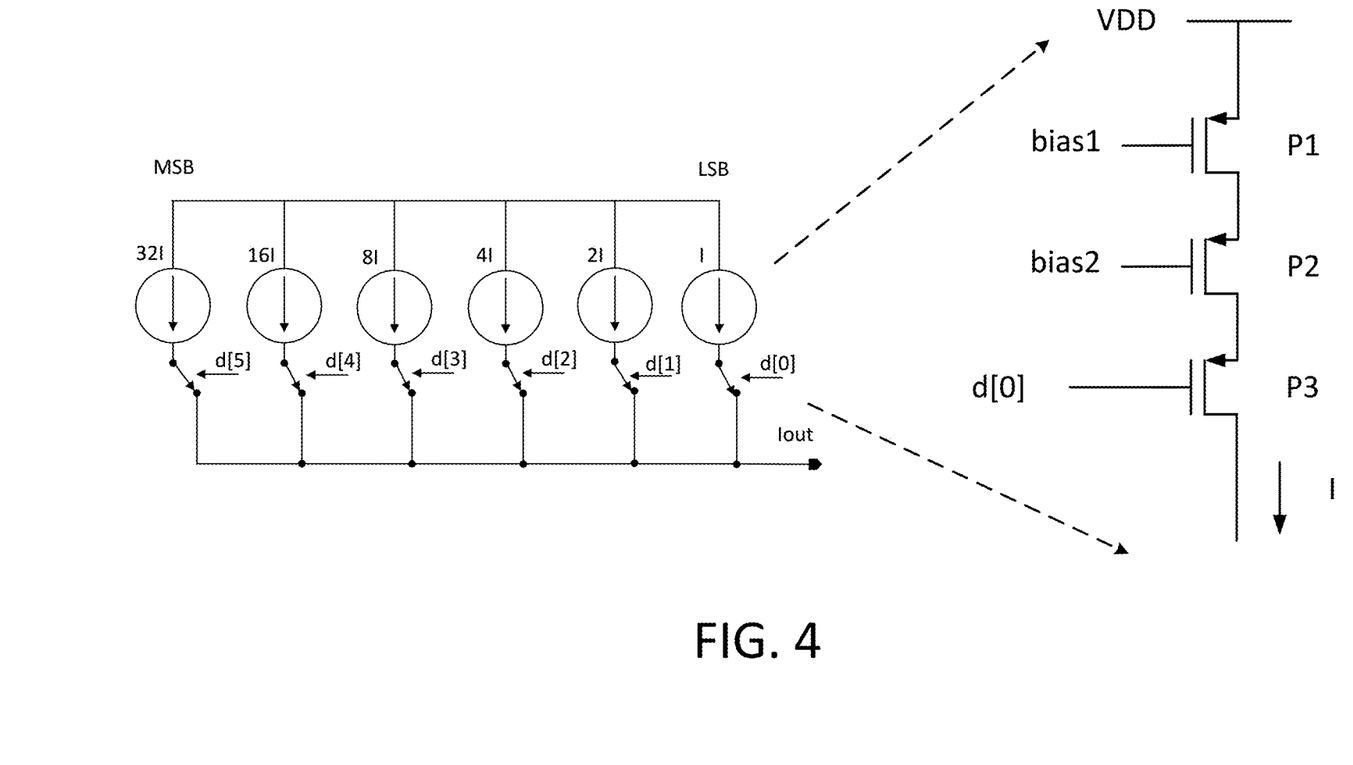
FIG. 4 shows a 6-bit binary embodiment of single-end current steering DAC

FIG. 4 illustrates an exemplary 6-bit binary embodiment of single-end current steering DAC 301. It consists of six binary current sources with current amount of 1I (LSB), 2I, 4I, 8I, 16I and 32I (MSB) respectively. The current are gated by switches wherein switches are controlled by input data d[5:0]. All the six current source outputs are summed together and produce current output Iout. The detailed LSB current source implementation is also illustrated, it consists of three PFET transistors in series. The first two PFET transistors P1, P2 are in cascoded configuration then followed by a switch P3. The gate of P1 and P2 are coupled to bias voltage and the gate of P3 is coupled to input data db[0].

Figure 5:
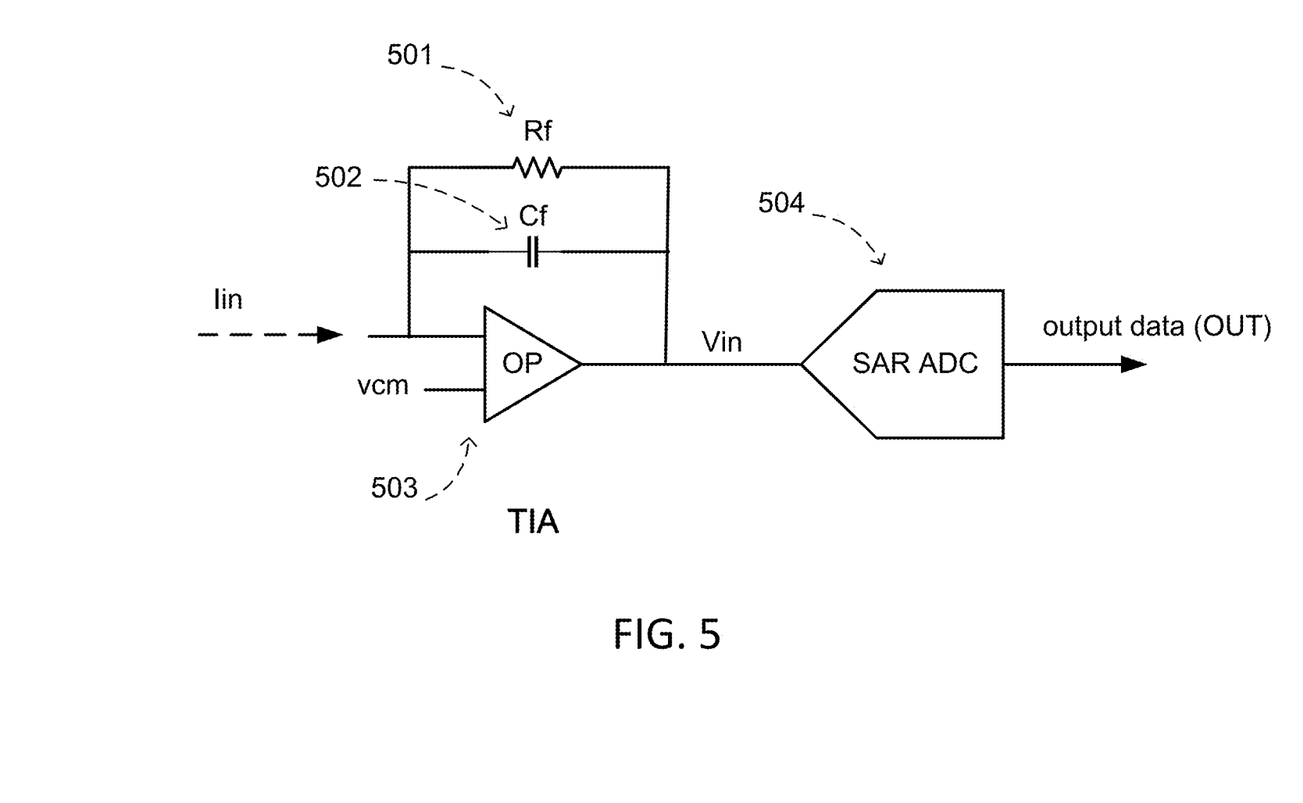
FIG. 5 shows the implementation of the transmit path using TIA

FIG. 5 illustrates the implementation of transmit path 202 using Trans-impedance Amplifier (TIA). Input current Iin represents the current sum of multiple memory elements output. TIA consists of feedback resistor Rf 501, feedback capacitor Cf 502 and operational amplifier 503. TIA converts the input current Iin to voltage Vin and Vin is sampled by SAR ADC 504 and converted to output data OUT. TIA output voltage Vin is described by the following equation:

$$V_{in} = vcm - Iin * R_f \quad \text{eq(1)}$$

Figure 6:
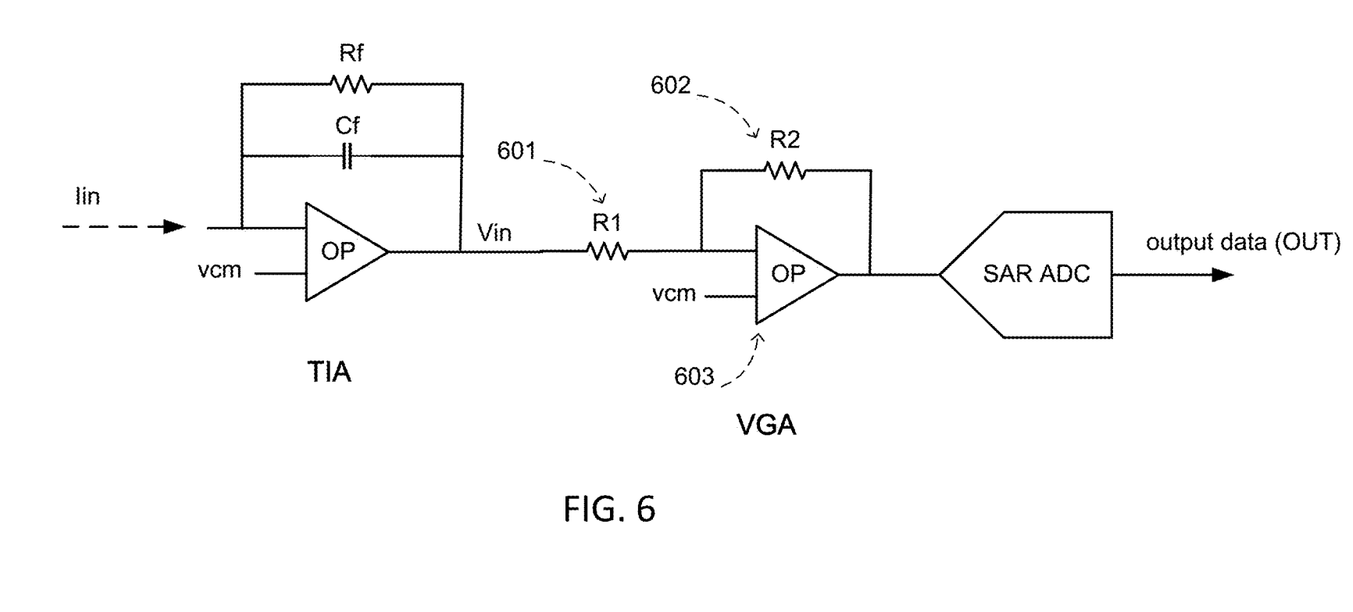
FIG. 6 shows the implementation of the transmit path using TIA and VGA

FIG. 6 illustrates another implementation of transmit path 202 with Variable Gain Amplifier inserted between TIA and SAR ADC. Variable Gain Amplifier (VGA) consists of input resistor R1 601 and feedback resistor R2 602 and operational amplifier 603. TIA output Vin is amplified by VGA with the gain equals to R2/R1. The amplified voltage is sampled by SAR ADC to produce output data OUT. Variable Gain Amplifier increases the signal amplitude and enhances Signal-to-Noise Ratio (SNR) of the transmit path.

Figure 7:
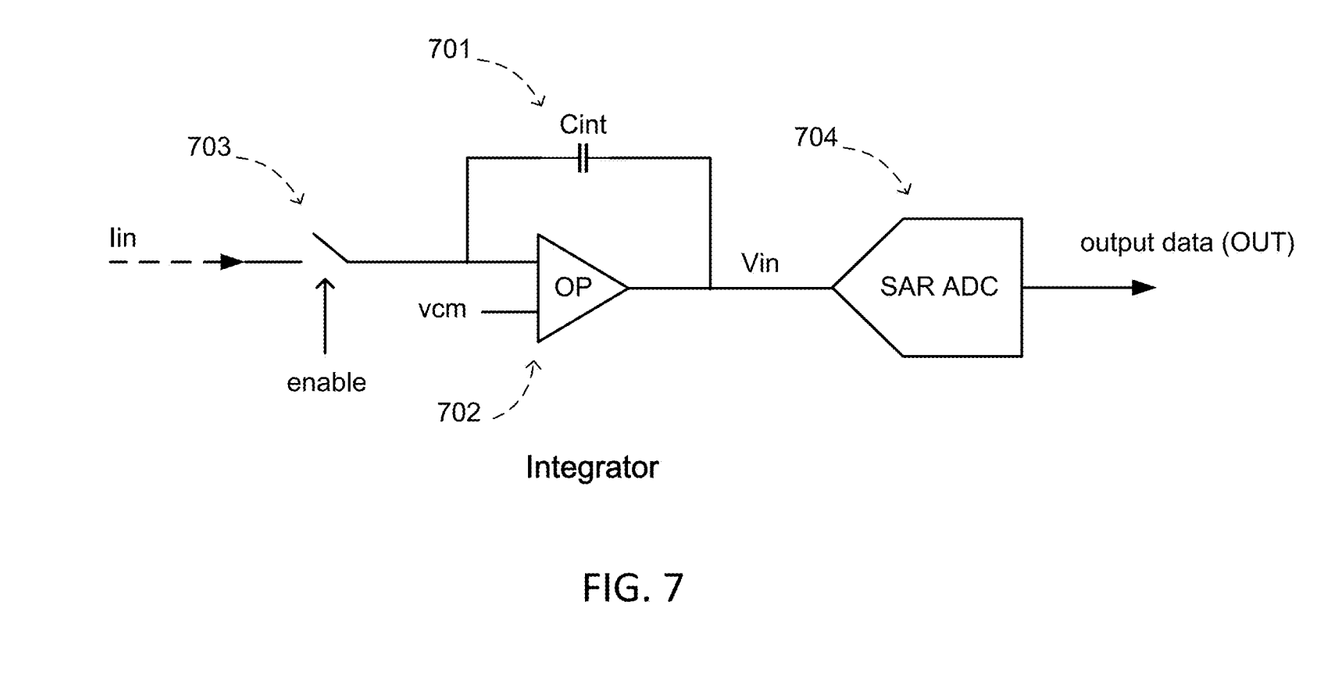
FIG. 7 shows the implementation of the transmit path using Integrator

FIG. 7 illustrates implementation of transmit path using integrator. Integrator consists of integrating capacitor Cint 701, operational amplifier 702 and switch 703 controlled by enable signal. When switch 703 is enabled, the current sum of multiple memory elements Iin charges capacitor Cint 701. This results in the change of Vin voltage. Vin voltage is then sampled by SAR ADC 704 and converted to output data OUT. Integrator output voltage is described by the following equation:

$$V_{in} = vcm + Iin * T / C_{int} \quad \text{eq(2)}$$

T is the time period that the switch enabled.

Figure 8:
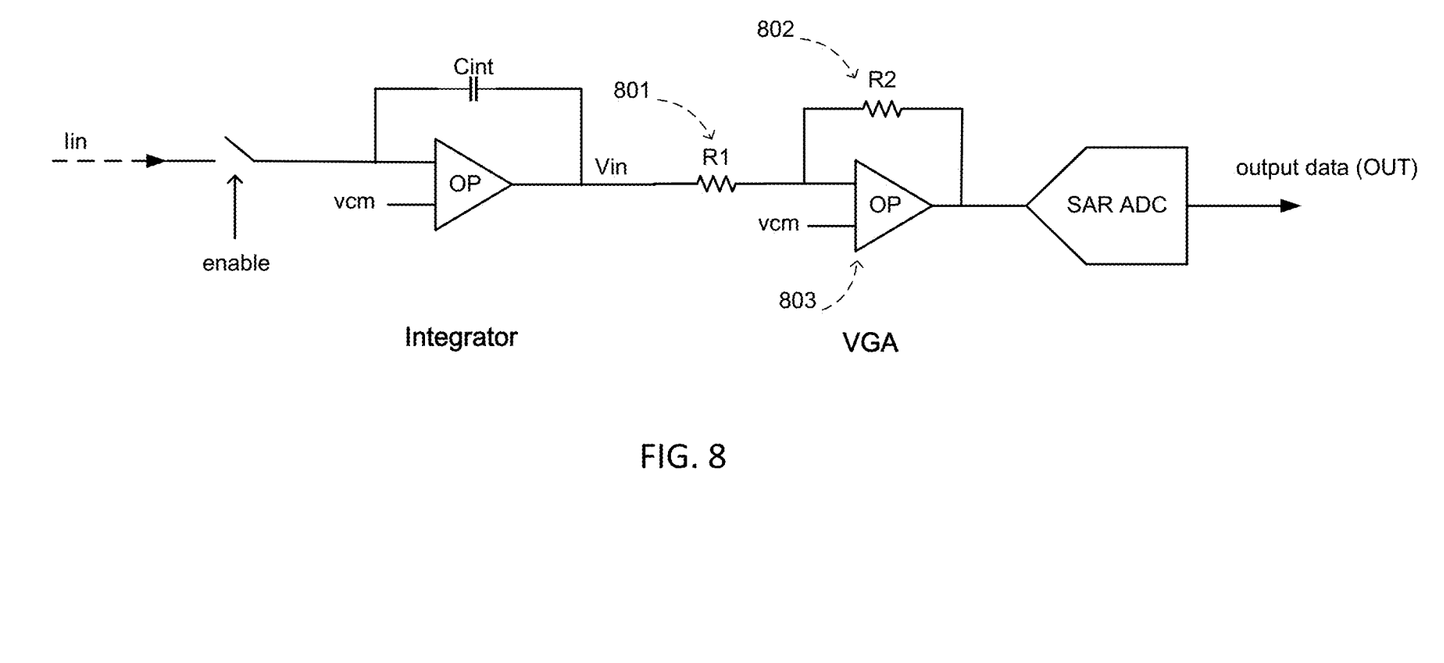
FIG. 8 shows another implementation of the transmit path using Integrator and VGA

FIG. 8 illustrates the implementation of transmit path with VGA inserted between Integrator and SAR ADC. Variable Gain Amplifier (VGA) consists of input resistor R1 801 and feedback resistor R2 802 and operational amplifier 803. Integrator output Vin is amplified by VGA with the gain equals to R2/R1. The amplified voltage is sampled by SAR ADC and produce output data OUT. Variable Gain Amplifier increases the signal amplitude and enhances Signal-to-Noise Ratio (SNR) of the transmit path.

Figure 9:
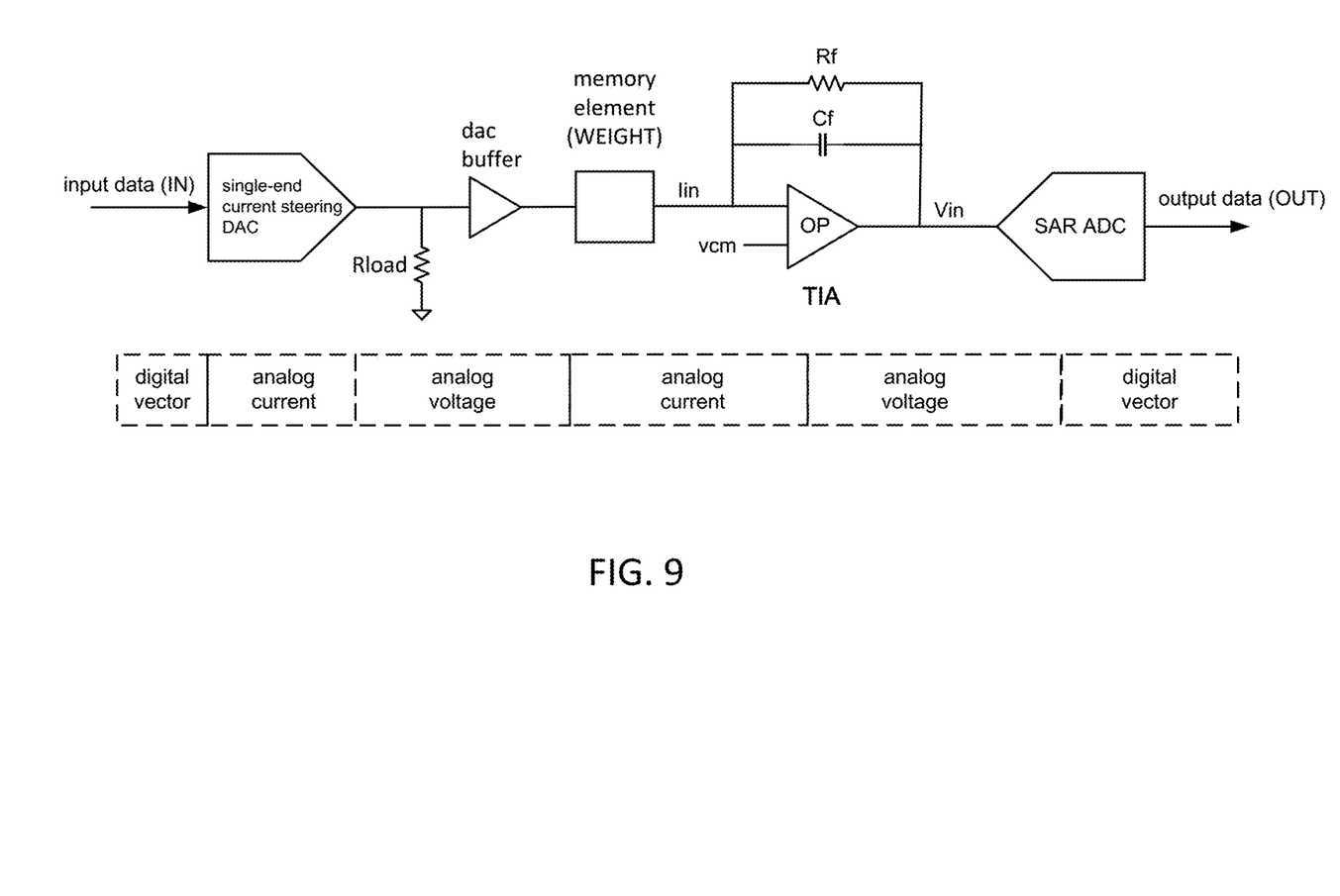
FIG. 9 shows the full signal path and corresponding domains of computing-in-memory

FIG. 9 shows the predominately full signal path of computing-in-memory. DAC converts input data into a current and this current becomes a voltage through resistor load. The voltage drives the multiple memory elements and generates a current Iin. The current Iin is fed into TIA and results in a corresponding voltage Vin at SAR ADC input. SAR ADC samples this voltage Vin and converts it to output data OUT. The input data, weights and output data in this signal path are the corresponding representations of the input data, weights and output data of MAC operation of FIG. 1. Also illustrates on FIG. 9 is the digital/analog domain in different stage of the signal path. It starts with digital vector then the data is converted to analog and finally yield digital vector after SAR ADC. During analog domain, signal goes through four current/voltage conversions.

The subject matter described above is provided by way of illustration only and should not be construed as limiting. Furthermore, the claimed subject matter is not limited to implementations that solve any or all disadvantages noted in any part of this disclosure. Various modifications and changes may be made to the subject matter described herein without following the example embodiments and applications illustrated and described, and without departing from the true spirit and scope of the present invention, which is set forth in the following claims.

What is claimed is:

1. A data converter for computing-in-memory, comprising:
    an N-row receive path, each receive path row including one Digital-to-Analog Converter (DAC) and multiple memory elements;
    an M-column transmit path coupled to the receive path in a mesh structure, wherein each transmit path column consists of one Analog-to-Digital Converter (ADC) and multiple memory elements; and
    a single-end current steering Digital-to-Analog Converter (DAC) and a resistor load to convert the input data to voltage output, wherein the voltage output is coupled to a buffer to drive multiple memory elements.

2. The data converter of claim 1, wherein multiple DAC, multiple memory elements, and multiple ADCs are coupled in a mesh structure to represent input data, weights and output data respectively for multiply-and-accumulate (MAC) operations.

3. The data converter of claim 1, wherein multiple DACs are coupled to multiple memory elements and multiple ADC are coupled to multiple memory elements; input data is coupled to multiple DACs, wherein the DAC drives multiple memory elements, and wherein a memory output is coupled to multiple ADC; and output data is coupled to ADC.

4. The data converter of claim 1, wherein the memory elements comprise N*M memory elements selected from either Static random-access memory (SRAM) or non-volatile Flash memory.

5. The data converter of claim 1, wherein the single-end current steering Digital-to-Analog Converter comprises a current source having three FET transistors in series; and two FET transistors form cascoded current source configuration and coupled to a third FET as a switch controlled by input data.

6. The data converter of claim 1, wherein the transmit path comprises a trans-impedance amplifier (TIA) and a variable gain amplifier (VGA) and a Successive-Approximation-Register Analog-to-Digital Converter (SAR ADC), wherein input current is coupled to TIA to produce output voltage; TIA output voltage is coupled to VGA; and VGA output voltage is sampled by the SAR ADC to yield output data.

7. The data converter of claim 1, wherein the transmit path comprises an integrator and a Successive-Approximation-Register Analog-to-Digital Converter (SAR ADC), wherein input current charges an integrating capacitor to produce voltage in a predetermined time period and integrator output is sampled by SAR ADC to produce output data.

8. The data converter of claim 1, wherein the transmit path comprises an integrator and a variable gain amplifier (VGA) and Successive-Approximation-Register Analog-to-Digital Converter (SAR ADC), wherein input current charges an integrating capacitor to produce voltage in a predetermined time period, the integrator output is coupled to the VGA and the VGA output is sampled by the SAR ADC to yield output data.

9. A method of data conversion for computing-in-memory, comprising:
- forming an N-row receive path and an M-column transmit path;
- coupling the paths in a mesh structure;
- converting each receive path row with one DAC and multiple memory elements;
- converting the input with a single-end current steering Digital-to-Analog Converter (DAC) and a resistor load to convert the input data to voltage output, wherein the voltage output is coupled to a buffer to drive multiple memory elements; and
- digitizing each transmit path column having one ADC and multiple memory elements.

10. A data converter for computing-in-memory, comprising:
- an N-row receive path, each receive path row including one Digital-to-Analog Converter (DAC) and multiple memory elements; and
- an M-column transmit path coupled to the receive path in a mesh structure, wherein each transmit path column consists of one Analog-to-Digital Converter (ADC) and multiple memory elements, wherein the transmit path comprises a trans-impedance amplifier (TIA) and a Successive-Approximation-Register Analog-to-Digital Converter (SAR ADC), wherein input current is coupled to TIA to produce output voltage and an output voltage is sampled by the SAR ADC to yield output data.

11. The method of claim 9, wherein the single-end current steering Digital-to-Analog Converter comprises a current source having three FET transistors in series; and two FET transistors form cascoded current source configuration and coupled to a third FET as a switch controlled by input data.

12. The method of claim 9, wherein multiple DAC, multiple memory element and multiple ADC are coupled in mesh structure to represent input data, weights and output data respectively for multiply-and-accumulate (MAC) operations.

13. The method of claim 9, wherein multiple DACs are coupled to multiple memory elements and multiple ADC are coupled to multiple memory elements; input data is coupled to multiple DACs, wherein the DAC drives multiple memory elements, and wherein a memory output is coupled to multiple ADC; and
- output data is coupled to ADC.

14. The method of claim 9, wherein the memory elements comprise N*M memory elements selected from either Static random-access memory (SRAM) or non-volatile Flash memory.

15. The method of claim 9, wherein the transmit path comprises a trans-impedance amplifier (TIA) and a Successive-Approximation-Register Analog-to-Digital Converter (SAR ADC), wherein input current is coupled to TIA to produce output voltage and an output voltage is sampled by the SAR ADC to yield output data.

16. The method of claim 9, wherein the transmit path comprises a trans-impedance amplifier (TIA) and a variable gain amplifier (VGA) and a Successive-Approximation-Register Analog-to-Digital Converter (SAR ADC), wherein input current is coupled to TIA to produce output voltage; TIA output voltage is coupled to VGA; and VGA output voltage is sampled by the SAR ADC to yield output data.

17. The method of claim 9, wherein the transmit path comprises an integrator and a Successive-Approximation-Register Analog-to-Digital Converter (SAR ADC), wherein input current charges an integrating capacitor to produce voltage in a predetermined time period and integrator output is sampled by SAR ADC to produce output data.

18. The method of claim 9, wherein the transmit path comprises an integrator and a variable gain amplifier (VGA) and Successive-Approximation-Register Analog-to-Digital Converter (SAR ADC), wherein input current charges an integrating capacitor to produce voltage in a predetermined time period, the integrator output is coupled to the VGA and the VGA output is sampled by the SAR ADC to yield output data.

* * * * *